United States Patent [19]

Kaneko

[11] Patent Number: 4,894,559

[45] Date of Patent: Jan. 16, 1990

[54] BUFFER CIRCUIT OPERABLE WITH REDUCED POWER CONSUMPTION

[75] Inventor: Shouji Kaneko, Tokyo, Japan

[73] Assignee: NEC Corporation, Tokyo, Japan

[21] Appl. No.: 94,557

[22] Filed: Sep. 9, 1987

[30] Foreign Application Priority Data

Sep. 9, 1986 [JP] Japan ................................. 61-213164

[51] Int. Cl.[4] ...................... H03K 17/04; H03K 3/356; H03K 19/01; G11C 7/00
[52] U.S. Cl. .................................... 307/530; 307/482; 307/578; 307/355; 365/203; 365/205
[58] Field of Search ............... 307/482, 578, 279, 355, 307/530, 269, 475, 603; 365/196, 203, 205

[56] References Cited

U.S. PATENT DOCUMENTS

| | | | |
|---|---|---|---|
| 4,239,993 | 12/1980 | McAlexander, III et al. | 307/530 |
| 4,397,000 | 8/1983 | Nagami | 307/530 X |
| 4,694,205 | 9/1987 | Shu et al. | 307/530 |
| 4,701,644 | 10/1987 | Campione | 307/530 |
| 4,719,600 | 1/1988 | Huffman et al. | 307/530 X |
| 4,733,373 | 3/1988 | Murotani | 365/203 |
| 4,739,499 | 4/1988 | Simpson | 365/205 |

*Primary Examiner*—Stanley D. Miller
*Assistant Examiner*—David R. Bertelson

[57] ABSTRACT

A buffer circuit which can operate with reduced power consumption and at a high speed is disclosed. The buffer circuit is of the type having a flip-flop circuit with a pair of output terminals and a pair of boot-strap circuits each provided for each of the output terminals and having a capacitor and a precharge circuit for precharging the capacitor, and is featured in that a pair of control circuits are provided to the pair of boot-strap circuits. Each of the control circuits allows the capacitor to be charged when the associated output terminal is about to produce a high level signal and inhibits the capacitor from being charged when the associated output terminal is about to produce a low level signal.

6 Claims, 2 Drawing Sheets

BUFFER CIRCUIT OPERABLE WITH REDUCED POWER CONSUMPTION

BACKGROUND OF THE INVENTION

The present invention relates to a buffer circuit employing field effect transistors, and more particularly to a buffer circuit of a boot-strap type.

Buffer circuits have been widely utilized in variety of digital ICs such as IC memories.

A typical conventional buffer employs a flip-flop circuit having a pair of output nodes and a pair of boot-strap circuits provided to the pair of output nodes. Each of the boot-strap circuit includes a capacitor for achieving the boot-strap function. However, in the conventional buffer circuit, the capacitors of both the boot-strap circuits are simultaneously precharged by an activation signal each time when the buffer circuit is about to produce new contents of output signals, although the boot-strap circuit coupled to the output terminal from which a low level signal is produced is not required to operate.

Therefore, unnecessary power is consumed by the above boot-strap circuit and the load of the activation signal is large because the activation signal is required to charge both of the capacitors, resulting in a low speed operation.

SUMMARY OF THE INVENTION

It is an object to provide a buffer circuit operable with a low power consumption.

It is another object of the present invent to provide a buffer circuit which can operate at a high speed.

The buffer circuit according to the present invention is of the type having a flip-flop circuit receiving a first input signal and a second input signal complementary to the first input signal and a first output node generating a first output signal complementary to the first input signal and a second output node generating a second output signal complementary to the second input signal, and first and second boot-strap circuits coupled to the first and second output nodes, respectively, each of the boot-strap circuits including a capacitor and a precharge circuit for operatively charging the capacitor by an activation signal, and is featured in that first and second precharge control circuits are provided for the first and second boot-strap circuits, respectively. The first precharge control circuit receives at least the first input signal and enables the precharge circuit of the first boot-strap when the first input signal is a low level and disenables the precharge circuit of the first boot-strap circuit when the first input signal is a high level. The second precharge control circuit receives at least the second input signal and enables the precharge circuit of the second boot-strap circuit when the second input signal is at low in level and disenables the precharge circuit of the second boot-strap circuit when the second input signal is at high in level.

According to the present invention, the capacitor of the boot-strap circuit coupled to the output node which is about to produce a high level of the output signal is charged while the capacitor of the other boot-strap circuit coupled to the other output node which is about to produce a low level of the output signal is not charged. Therefore, a power consumption required by the capacitor of the bootstrap circuit coupled to the output node which generates a low level output signal is effectively removed. Also, the charge of the capacitor of the boot-strap circuit coupled to the high level output node can be made rapidly than the case where both capacitors are charged so that a high speed operation can attained.

DETAILED DESCRIPTION OF THE INVENTION

Figure 1:
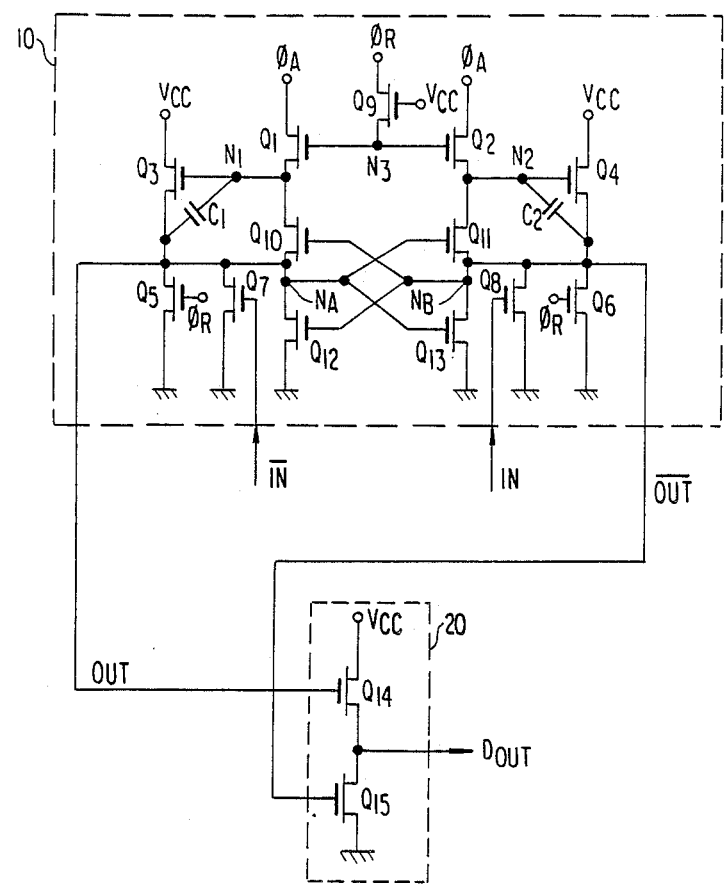
FIG. 1 is a schematic circuit diagram showing a buffer circuit according to a prior art.

Referring to FIG. 1, an data output buffer circuit according to a prior art is explained. Throughout the following explanation, field effect transistors employed are all N channel type MOS transistors as representative example of field effect transistors.

The buffer circuit includes a latch section 10 and a push-pull output section 20. The latch section 10 receives true and complementary input signals IN and $\overline{\text{IN}}$ and generates true and complementary buffered signals OUT and $\overline{\text{OUT}}$ The push-pull output section 20 generates an data output signal $D_{OUT}$ in accordance with the buffered signals OUT and $\overline{\text{OUT}}$ In the latch section 10, input transistors $Q_7$ and $Q_8$ receiving the input signals $\overline{\text{IN}}0$ and IN, respectively and hold transistors $Q_{12}$ and $Q_{13}$ form a flip-flop circuit with reset transistors $Q_5$ and $Q_6$. Transistors $Q_1$, $Q_3$ and $Q_{10}$ and a boot-strap capacitor $C_1$ form an active load circuit for an output node NA from which the buffered signal OUT is produced, while transistors $Q_2$, $Q_4$ and $Q_{11}$ and a capacitor $C_2$ form an active load circuit for an output node NA from which the buffered signal $\overline{\text{OUT}}$ is produced. The active load circuits are reset by a reset signal $\phi_R$ and enabled or activated in response to an activation signal $\phi_A$.

Figure 2:
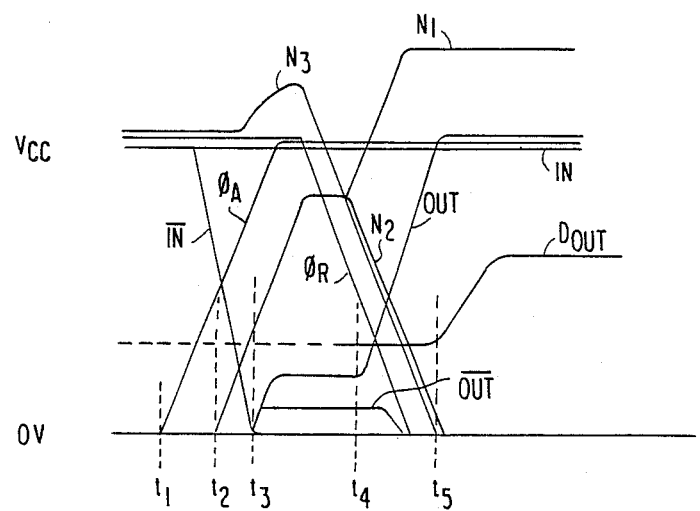
FIG. 2 is a wave-form diagram showing an operation of the circuit in FIG. 1.

With reference to FIG. 2, an operation of the circuit of FIG. 1 is explained.

Prior to a time point $t_1$, the signal $\phi_A$ is at low and the signal $\phi_R$ is at high in level, while both of input signals IN and $\overline{\text{IN}}$ are at high in level. Therefore, both of the buffered signals OUT and $\overline{\text{OUT}}$ are at low (ground potential) in level because the transistors $Q_5$, $Q_6$, $Q_7$ and $Q_8$ are conducting. As a result, both transistors $Q_{14}$ and $Q_{15}$ in the output section 20 are non-conducting so that the output signal $D_{OUT}$ is at a high impedance state as illustrated by a dotted portion. At the time point $t_1$, the signal $\phi_A$ is raised from the ground potential toward a power voltage $V_{cc}$. Also, development of the states of the input signals IN and $\overline{\text{IN}}$ are started and the signal $\overline{\text{IN}}$ is fallen to the ground potential while the signal IN is kept at high ($V_{cc}$) in level. In response to rise of the signal $\phi_A$ in potential, a node $N_3$ as the gates of the transistors $Q_1$ and $Q_2$ is raised above $V_{cc}$ by self-boost effect due to gate-source capacitances of the transistors $Q_1$ and $Q_2$ at a time point $t_2$. Thus, the transistors $Q_1$ and $Q_2$ are conducting in the non-saturated region to start charging of the nodes $N_1$ and $N_2$. In this instance, the capacitors $C_1$ and $C_2$ are charged. When the levels at the nodes $N_1$ and $N_2$ exceed the threshold voltage of the transistors $Q_3$ and $Q_4$ at a time point $t_3$, the transistors $Q_3$ and $Q_4$ become conductive. Thus, the level of the signal OUT at the node NA is determined according to the ratio of the on-resistance of the transistor $Q_3$ to that of the transistor $Q_5$, while the level of the signal $\overline{OUT}$ at the node NB is determined according to the ratio of the on-resistance of the transistor $Q_4$ to the parallel value of the on-resistances of the transistors $Q_8$ and $Q_6$. Therefore, the signal $\overline{OUT}$ is slightly lower than the signal OUT but they are relatively low levels. In this instance, it should be noted that DC current flows from $V_{cc}$ to the ground through the path of the transistors $Q_3$ and $Q_5$ and the path of the transistors $Q_4$, $Q_6$ and $Q_8$. Therefore, a relatively large power is uneffectively consumed.

Then, when the reset signal $\phi_R$ becomes lower than the threshold voltage of the transistors $Q_5$ and $Q_6$, the transistors $Q_5$ and $Q_6$ become non-conductive. As a result, the node NA (OUT) starts to rise towards $V_{cc}$ and the potential at the node N is raised above $V_{cc}$ by the boot-strap effect through the capacitor $C_1$. While the transistors $Q_8$ and $Q_{11}$ remain conducting to discharge the node $N_2$ and the transistor $Q_2$ becomes non-conducting so that the signal $\overline{OUT}$ falls in level.

When the signal OUT exceeds the threshold voltage of the transistor $Q_{14}$ in the output section at a time point $t_5$, the transistor $Q_{14}$ becomes conducting with the transistor $Q_{15}$ non-conducting so that the output signal $D_{OUT}$ becomes high in level.

As explained above, the conventional buffer circuit of FIG. 1, inevitably consumes a large amount of power. Moreover, the signal $\phi_A$ is used to charge both of the capacitors $C_1$ and $C_2$ and the load of the signal $\phi_A$ is large. Therefore, it requires a relative large time period to charge the capacitors, resulting in a low speed operation.

Figure 3:
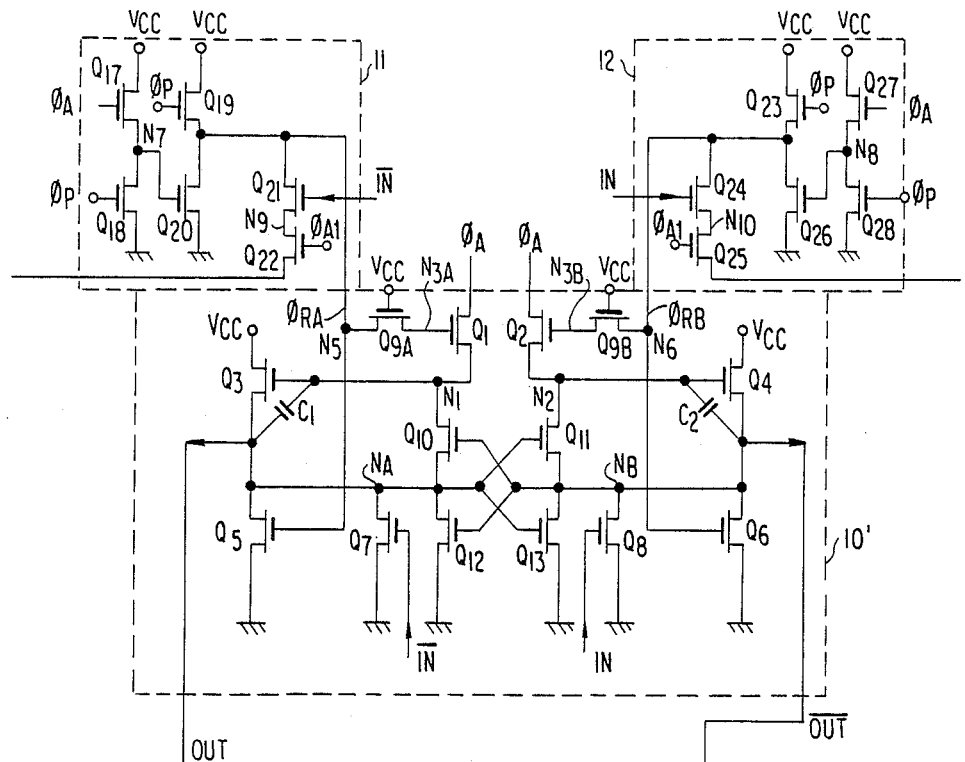
FIG. 3 is a schematic circuit diagram showing a buffer circuit according to a preferred embodiment of the invention.

Referring to FIG. 3, a buffer circuit according to a preferred embodiment of the present invention is explained.

In FIG. 3, the elements corresponding to those in FIG. 1 are denoted by the same reference codes used in FIG. 1.

As shown in FIG. 3, the latch section 10' is different from the latch circuit in FIG. 1 in that the gates of the transistors $Q_5$ and $Q_6$ pare connected to nodes $N_5$ and $N_6$, respectively and transistors $Q_{9A}$ and $Q_{9B}$ are connected between the gate N3A of the transistor $Q_1$ and the node N5, and between the gate N3B of the transistor $Q_2$ and the node N6, respectively. The node N5 is supplied with a selective reset signal $\phi_{RA}$ generated by a selective control circuit 11. The node N6 is supplied with a selective reset signal $\phi_{RB}$ generated by a selective control circuit 12. Namely, the present invention is featured in that the transistors $Q_1$ and $Q_5$ in the left side is controlled by the selective reset signal $\phi_{RA}$ while the transistors $Q_2$ and $Q_6$ in the right side are controlled by the selective reset signal $\phi_{RB}$. The selective control circuit 11 receives a precharge signal $\phi_P$, a timing control signal $\phi_{AI}$, the activation signal $\phi_A$, and the input signals IN and $\overline{IN}$ and includes transistors $Q_{17}$ to $Q_{22}$. The transistors $Q_{17}$ to $Q_{20}$ operate as a precharged type inverter for inverting the signal $\phi_A$ with a slight delay. The transistors $Q_{21}$ and $Q_{22}$ operate as a clocked inverter for inverting the input signal $\overline{IN}$ when the signal $\phi_{AI}$ is at a high level. Therefore, the selective reset signal $\phi_{RA}$ can be substantially equivalent to the NOR result of $\phi_A$ and $\overline{IN}$ Since the timing signal $\phi_{AI}$ is such signal that rises in potential when the precharge signal $\phi_P$ falls and before the rise of the activation signal $\phi_A$, the selective control signal $\phi_{RA}$ falls in level at a time slightly after $\phi_A$ is raised in level in the case where the input signal $\overline{IN}$ is at a low level, and at an early time when $\phi_{A1}$ is raised in level and before the rise of $\phi_A$ in the case where the input signal $\overline{IN}$ at a high level. Therefore, the selective signal $\phi_{RA}$ is deactivated to the low level before the rise of $\phi_A$ when the input signal $\overline{IN}$ to the left side of the latch circuit 20' is high in level and the buffered signal OUT is about to be a low level thereby to block DC current through the transistors $Q_1$, $Q_7$ and $Q_5$.

To the contrary, when the input signal $\overline{IN}$ is at a high level and the low level of the buffered signal OUT is to be developed, the selective reset signal $\phi_{RA}$ falls in level after the activation signal is raised in level so that the transistors $Q_1$ and $Q_5$ are conducting to charge the node $N_1$ and the capacitor $C_l$.

Similarly, the selective control circuit 12 composed of transistors $Q_{23}$ to $Q_{28}$, receives $\phi_A$, $\phi_{AI}$, $\phi_P$ and the input signals IN and $\overline{IN}$ and generates the NOR result of the activation signal $\phi_A$ and the input signal IN. The selective reset signal $\phi_{RB}$ applied to the right side of the latch circuit 20'falls in level at a time when the signal $\phi_A$ is raised in level in the case of the low level of IN and at an early time when the signal $\phi_{AI}$ is raised in level but before the rise of $\phi_A$ in the case of the high level of IN.

Accordingly, the capacitor $C_2$ and the node $N_2$ are charged only when the input signal $\overline{IN}$ is at a low level and the buffered signal $\overline{OUT}$ is about to be high in level.

Figure 4:
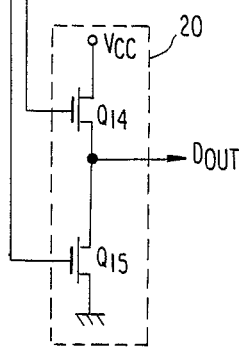
FIG. 4 is a wave-form diagram showing an operation of the circuit in FIG. 3.
Figure 4:
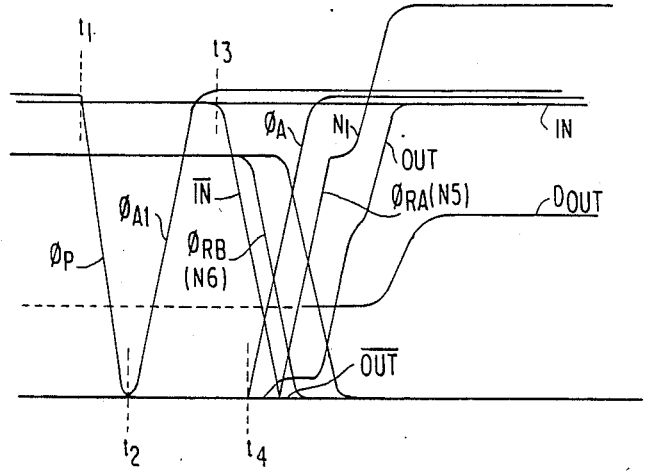

With reference to FIG. 4, an operation of the circuit in FIG. 3 is explained.

Prior to a time point $t_1$, the precharge signal $\phi_P$ is at a high ($V_{cc}$) level so that the nodes N5 and N6 are kept high in level. Therefore, the gate nodes N3A and N3B of the transistors $Q_1$ and $Q_2$ are charged through the transistors $Q_{9A}$ and $Q_{9B}$, respectively, while the buffered signals OUT (NA) and $\overline{OUT}$ are low in level due to the conducting transistors $Q_5$ and $Q_6$. In this instance, the input signals IN and $\overline{IN}$ are high level so that the transistors $Q_7$ and $Q_8$ are conducting. At a time point $t_2$, the precharge signal $\phi_P$ is charged to the low (ground) level and the signal $\phi_{A1}$ changes to a high level from the low level to turn the transistors $Q_{20}$ and $Q_{25}$ conducting. At a time point $t_3$, the states of the input signals IN and $\overline{IN}$ are developed, and in this case the signal $\overline{IN}$ is changed to the low level with the input signal IN at a high level.

Thereafter, the charge at the node $N_6$ is discharged to the low level of the input signal $\overline{IN}$ through the transistors $Q_{24}$ and $Q_{25}$ so that the selective reset signal $\phi_{RB}$ falls towards the low level so that the transistors $Q_2$ and $Q_6$ are made non-conductive. In this instance, the charge at the node N5 is still maintained and the transistors $Q_1$ and $Q_5$ are still conducting because the transistor $Q_{21}$ is non-conducting.

At a time point $t_4$, the activation signal $\phi_A$ is changed to a high level and the signal $\phi A$ is transmitted the node $N_1$ through the conductive transistor $Q_l$ but not transmitted to the node $N_2$ because the transistor $Q_2$ is non-conductive. Accordingly, the node $N_1$ and the capacitor $C_l$ is charged approximately by the voltage of $\phi_A$. In this instance, the capacitor $C_2$ is not charged. After a delay time due to the transistors $Q_{17}$ to $Q_{20}$ from the rise of $\phi_A$, the charge at the node N5, i.e. the selective reset signal $\phi_{RA}$ is changed to the low level so that the transistors $Q_1$ and $Q_5$ are turned off. Accordingly, the node NA, i.e. the buffered signal OUT is raised in potential through the transistor $Q_3$ and such rise at the node NA is positively fed back to the node $N_1$ through the charged capacitor $C_1$ by the boot-strap effect. Thus, the buffered signal OUT is raised to the power voltage. While the transistor $Q_8$ is conducting and the charge at the node $N_2$ is discharged, and therefore the buffered signal $\overline{OUT}$ at the node NB is kept at the low level. As a result, the transistor $Q_{14}$ is conducting with the transistor $Q_{15}$ non-conducting so that the output $D_{OUT}$ is raised to the high level (Vcc-Vth, Vth being a threshold voltage of $Q_{14}$).

As explained above, according to the present invention, the activation signal $\phi A$ is applied only to the capacitor $C_l$ which is used to produce the high level signal OUT. Therefore, the consumption required by the signal $\phi_A$ is remarkably reduced to the half and the load of $\phi_A$ is also reduced. Also, the charge of the capacitor ($C_1$) is made at a high speed so that a high speed operation can be achieved.

I claim:

1. A buffer circuit comprising a flip-flop circuit having first and second input terminals, and first and second output terminals; a first boot-strap circuit coupled to said first output terminal, and including a first capacitor and a first precharge circuit for operatively charging said capacitor; a second boot-strap circuit coupled to said second output terminal and including a second capacitor and a second precharge circuit for operatively charging said second capacitor; a first control circuit coupled to said first precharge circuit for enabling said first precharge circuit when said first output terminal is to be made high in level and disenabling said first precharge circuit when said first output terminal is to be made low in level; and a second control circuit coupled to said second precharge circuit for enabling said second precharge circuit when said second output terminal is to be made high in level and disenabling said second precharge circuit when said second output terminal is to be made low in level.

2. The circuit according to claim 1, in which said flip-flop circuit includes a pair of cross-coupled transistors having gates and drains cross-coupled at said first and second output terminals and sources coupled to a reference voltage terminal, a first input transistor coupled between said first output terminal and said reference voltage terminal and having a gate connected to said first input terminal, and a second input transistor coupled between said second output terminal and said reference voltage terminal and having a gate connected to said second input terminal.

3. The circuit according to claim 1, in which said first boot-strap circuit includes a first load transistor coupled between a power voltage terminal and said first output terminal, said first capacitor being coupled between the gate of said first load transistor and said first output terminal, and said second boot-strap circuit includes a second load transistor coupled between said power voltage terminal and said second output terminal, said second capacitor being coupled between the gate of said second load transistor and said second output terminal.

4. The circuit according to claim 1, in which said first precharge circuit includes a first transfer transistor coupled between a control node and one end of said first capacitor and a first reset transistor coupled between the other end of said first capacitor and said reference voltage terminal, and said second precharge circuit includes a second transfer transistor coupled between said control node and one end of said second capacitor and a second reset transistor coupled between the other end of said second capacitor and said reference voltage terminal, said control node receiving a precharge execution signal.

5. The circuit according to claim 1, in which said first control circuit includes a first NOR gate having a first input node coupled to said first input terminal and a second input node receiving a timing signal for executing the precharge of said first capacitor, and said second control circuit includes a second NOR gate having a first input node coupled to said second input terminal and a second input node receiving said timing signal.

6. A buffer circuit comprising a first transistor coupled between a first node and a second node, a second transistor coupled between said first node and a third, a third transistor coupled between said second node and a first output terminal and having a gate coupled to a second output terminal, a fourth transistor coupled between said third node and second output terminal and having a gate coupled to said first output terminal, a fifth transistor coupled between said first output terminal and a reference voltage terminal and having a gate coupled to said second output terminal, a sixth transistor coupled between said second output terminal and said reference voltage terminal and having a gate coupled to said first output terminal, a seventh transistor coupled between said first output terminal and said reference voltage terminal and having a gate coupled to a first input terminal, an eighth transistor coupled between said second output terminal and said reference voltage terminal and having a gate coupled to a second input terminal, a ninth transistor coupled to a power voltage terminal and said first output terminal and having a gate coupled to said second node, a tenth transistor coupled between said power voltage terminal and said second output terminal and having a gate coupled to said third node, a first capacitor coupled between said second node and first output terminal, a second capacitor coupled between said third node and said second output node, a first precharge circuit coupled to said first capacitor and the gate of said first transistor for operatively charging said first capacitor when said first input terminal receives a low level signal, a second precharge circuit coupled to said second capacitor and the gate of said second transistor for operatively charging said second capacitor when said second input terminal receives a low level of signal, and means for applying a timing signal to said first node.

* * * * *

UNITED STATES PATENT AND TRADEMARK OFFICE
CERTIFICATE OF CORRECTION

PATENT NO. : 4,894,559

DATED : January 16, 1990

INVENTOR(S) : Shouji Kaneko

It is certified that error appears in the above-identified patent and that said Letters Patent is hereby corrected as shown below:

Column 2, line 32, delete "$\overline{IN0}$", and insert --$\overline{IN}$--.

Column 3, line 18, delete "N" and insert --$N_1$--.

Column 3, line 43, delete "pare", and insert --are--.

Column 4, line 56, delete "$\phi A$", and insert --$\phi_A$--

Signed and Sealed this

Nineteenth Day of February, 1991

Attest:

HARRY F. MANBECK. JR.

*Attesting Officer*   *Commissioner of Patents and Trademarks*